(12) United States Patent
Uchida

(10) Patent No.: US 9,209,060 B2
(45) Date of Patent: Dec. 8, 2015

(54) MOUNTING TABLE STRUCTURE AND METHOD OF HOLDING FOCUS RING

(71) Applicant: Tokyo Electron Limited, Tokyo (JP)

(72) Inventor: Yohei Uchida, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 79 days.

(21) Appl. No.: 14/090,355

(22) Filed: Nov. 26, 2013

(65) Prior Publication Data

US 2014/0146434 A1    May 29, 2014

Related U.S. Application Data

(60) Provisional application No. 61/733,503, filed on Dec. 5, 2012.

(30) Foreign Application Priority Data

Nov. 27, 2012   (JP) ................. 2012-258687

(51) Int. Cl.
*H02N 13/00* (2006.01)
*H01L 21/683* (2006.01)
*H01J 37/32* (2006.01)

(52) U.S. Cl.
CPC ....... *H01L 21/6833* (2013.01); *H01J 37/32642* (2013.01); *H01J 37/32697* (2013.01); *H01J 37/32715* (2013.01); *H01L 21/6831* (2013.01)

(58) Field of Classification Search
USPC ....................................... 361/234
See application file for complete search history.

(56) References Cited

U.S. PATENT DOCUMENTS

| | | | | |
|---|---|---|---|---|
| 6,464,794 B1 * | 10/2002 | Park et al. | ..................... | 118/728 |
| 6,723,202 B2 * | 4/2004 | Nagaiwa et al. | ......... | 156/345.43 |
| 8,702,903 B2 * | 4/2014 | Miyagawa et al. | ...... | 156/345.53 |
| 2004/0261946 A1 * | 12/2004 | Endoh et al. | ............. | 156/345.15 |
| 2005/0172904 A1 * | 8/2005 | Koshimizu et al. | ........... | 118/728 |
| 2008/0239691 A1 * | 10/2008 | Miyagawa et al. | ........... | 361/809 |

FOREIGN PATENT DOCUMENTS

JP     2002-016126 A    1/2002

* cited by examiner

*Primary Examiner* — Ronald W Leja
(74) *Attorney, Agent, or Firm* — Pearne & Gordon LLP

(57) ABSTRACT

A mounting table structure includes a sheet, having thermal conductivity, provided between a focus ring and a base member; a pressing member having a pressing surface that presses the focus ring toward the base member and contact surfaces, facing downward, arranged at a predetermined interval in a circumferential direction thereof; and a supporting member that is connected to the base member and has first and second contact surfaces. Further, the first contact surfaces and the second contact surfaces are arranged at the predetermined interval in the circumferential direction such that the second and first contact surfaces are alternately arranged. Moreover, the first contact surfaces are located at a position different from that of the second contact surfaces in a height direction, and the contact surfaces of the pressing member are protruded at a distance larger than distances of the first and second contact surfaces in the height direction.

6 Claims, 12 Drawing Sheets

MOUNTING TABLE STRUCTURE AND METHOD OF HOLDING FOCUS RING

CROSS-REFERENCE TO RELATED APPLICATION

This application claims the benefit of Japanese Patent Application No. 2012-258687 filed on Nov. 27, 2012, and U.S. Provisional Application Ser. No. 61/733,503 filed on Dec. 5, 2012, the disclosures of which are incorporated herein by reference.

TECHNICAL FIELD

The embodiments described herein pertain generally to a mounting table structure and a method of holding a focus ring.

BACKGROUND

In a manufacturing process of a semiconductor device, a processing target object, i.e., a wafer is attracted to and held on an electrostatic chuck of a mounting table, and a plasma process such as etching process or film forming process is performed on the wafer. In general, the mounting table includes the electrostatic chuck; and a base member configured to support the electrostatic chuck. The base member is provided with a temperature control unit configured to control the temperature of the wafer. In order to perform the plasma process uniformly on an entire region of the wafer, a focus ring is provided on the base member to surround the wafer.

To perform the process uniformly on the entire region of the wafer, a temperature of the focus ring needs to be controlled with high precision. In order to control the temperature of the focus ring precisely, heat resistance between the base member of the mounting table and the focus ring needs to be reduced. For the purpose, conventionally, there has been employed a mounting table structure in which a sheet having elasticity and thermal conductivity is provided between the base member and the focus ring. An Example of such a mounting table structure is described in Japanese Patent Laid-open Publication No. 2002-016126 (Patent Document 1).

The mounting table structure in the Patent Document 1 includes a base member (mounting table), a ring-shaped member and a pressing member. The base member has a mounting surface, a ring-shaped mounting surface and a protruding part. An electrostatic chuck is provided on the mounting surface. The ring-shaped mounting surface is provided outside the mounting surface, and a focus ring is disposed on the ring-shaped mounting surface with a sheet having elasticity and thermal conductivity therebetween. The protruding part is provided outside the ring-shaped mounting surface. The ring-shaped member is fastened to the protruding part by a screw. The pressing member is fastened to the ring-shaped member by a screw with a bottom surface of the pressing member in contact with the ring-shaped member. Further, a flange of the pressing member comes into contact with a thin portion of the focus ring from above to press the focus ring against the ring-shaped mounting surface. In this mounting table structure, as the focus ring is pressed downward by the pressing member, a thickness of the sheet is reduced and the sheet is brought into firm contact with the focus ring and the base member. As a result, thermal resistance between the base member and the focus ring may be reduced.

Patent Document 1: Japanese Patent Laid-open Publication No. 2002-016126

In the mounting table structure described in Patent Document 1, a thickness decrement of the sheet is determined depending on various factors such as the thickness of the sheet, a thickness of the ring-shaped member, a thickness of the thin portion of the focus ring, a distance between the bottom surface of the pressing member and the flange in a height direction, and so forth. Therefore, it may be difficult to adjust the thickness decrement of the sheet. Further, the thickness decrement of the sheet may be varied depending on variations of the aforementioned sizes resulted from manufacturing errors. If the thickness decrement of the sheet is small, the thermal resistance between the base member and the focus ring would be increased, so that the temperature of the focus ring to which heat is transferred from plasma would also be increased. Meanwhile, if the thickness decrement of the sheet is large, a great force would be applied on the components pressing the sheet, i.e., the focus ring and the pressing member, so that these components may be damaged.

In order to adjust the thickness decrement of the sheet in the mounting table structure described in Patent Document 1, a distance between the ring-shaped member and the pressing member needs to be adjusted. For example, the pressing member needs to be fastened to the ring-shaped member by a screw while spaced apart from the ring-shaped member. In this configuration, the pressing member may be fastened to the ring-shaped member by controlling the torque of the screw precisely. Since, however, the torque of the screw changes with the lapse of time, the thickness decrement of the sheet may not be maintained constant.

SUMMARY

In view of the foregoing, example embodiments provide a technique capable of adjusting a thickness decrement of a sheet serving as a heat transfer medium, and capable of maintaining a set thickness decrement of the sheet.

In one example embodiment, a mounting table structure includes an electrostatic chuck at a central region thereof and a base member that mounts thereon a focus ring along a periphery of the electrostatic chuck. The mounting table structure includes a sheet, having elasticity and thermal conductivity, provided between the focus ring and the base member; a pressing member provided along a periphery of the focus ring, and configured to press the focus ring toward the base member to contract the sheet; and a supporting member connected to the base member. Further, the pressing member includes a pressing surface that presses the focus ring toward the base member and a multiple number of contact surfaces that face downward and are arranged at a preset interval in a circumferential direction thereof. The supporting member includes first contact surfaces and second contact surfaces. The first contact surfaces are arranged at the preset interval in the circumferential direction, and the second contact surfaces are arranged at the preset interval in the circumferential direction such that the second contact surfaces and the first contact surfaces are alternately arranged. Furthermore, the first contact surfaces are located at a position different from that of the second contact surfaces in a height direction, and the contact surfaces of the pressing member are protruded from portions of the pressing member at a distance larger than distances of the first contact surfaces and the second contact surfaces in the height direction. Moreover, a thickness decrement of the sheet is set by contacting the pressing member with the supporting member.

In this mounting table structure, by selecting a position of the pressing member on the supporting member connected to the base member in the circumferential direction, the contact surfaces of the supporting member that would make contact with multiple contact surfaces of the pressing member can be selected from the first contact surfaces and the second contact surfaces. Accordingly, a position of the pressing surface in the height direction can be determined, and a distance between the pressing surface of the pressing member and the base member in the height direction can be adjusted. As a result, a thickness decrement of the sheet provided between the base member and the pressing surface can be adjusted. By way of example, when the thickness decrement of the sheet is large, the contact surfaces of the pressing member would be brought into contact with the contact surfaces of the supporting member located at a higher position. Meanwhile, if the thickness decrement of the sheet is small, the contact surfaces of the pressing member would be brought into contact with the contact surfaces of the supporting member located at a lower position. In this way, the thickness decrement of the sheet can be adjusted. Further, since the pressing member is fastened to the supporting member while the pressing member is in contact with the supporting member, it may be possible to firmly fasten the pressing member to the supporting member without being affected by loosening of screws, or the like. As a consequence, a set thickness decrement of the sheet can be maintained.

In the example embodiment, the supporting member may further include third contact surfaces. The third contact surfaces may be arranged at the preset interval in the circumferential direction and are located at a position different from those of the first contact surfaces and the second contact surfaces in the height direction, and the contact surfaces of the pressing member may be protruded from the portions of the pressing member at a distance larger than distances of the first contact surfaces, the second contact surfaces and the third contact surfaces in the height direction. In this configuration, by way of example, among the first contact surfaces, the second contact surfaces and the third contact surfaces, the position of the contact surfaces located at a midway position in the height direction may be set to correspond to a design value of the thickness decrement of the sheet, and a distance between the contact surfaces of the supporting member can be set to correspond to an adjustment range of the thickness decrement of the sheet. With this configuration, if an actual thickness decrement of the sheet is larger than the design value, the contact surfaces of the pressing member may be brought into contact with the contact surfaces of the supporting member located at a higher position. Meanwhile, if an actual thickness decrement of the sheet is smaller than the design value, the contact surfaces of the pressing member may be brought into contact with the contact surfaces of the supporting member located at a lower position. As a result, the thickness decrement of the sheet can be made to be approximate to the design value.

In the example embodiment, the supporting member and the base member may serve as a single body. In this configuration, the number of constituent components of the mounting table structure can be reduced, and a manufacturing cost can be cut.

In another example embodiment, a method of holding a focus ring in a mounting table structure includes an electrostatic chuck at a central region thereof and a base member that mounts thereon a focus ring. The method includes mounting the focus ring along a periphery of the electrostatic chuck such that a sheet having elasticity and thermal conductivity is provided between the base member and the focus ring; adjusting a distance between a pressing surface of a pressing member contacted to the focus ring and the base member in a height direction by determining a position in the height direction where the pressing member comes into contact with a supporting member connected to the base member by selecting a position of the pressing member on the supporting member in a circumferential direction; and fastening the pressing member to the supporting member while the pressing member is in contact with the supporting member at the determined position in the height direction.

In this method, by selecting a position of the pressing member on the supporting member connected to the base member in a circumferential direction, a distance between the pressing surface of the pressing member and the base member in the height direction can be adjusted. As a result, a thickness decrement of the sheet provided between the base member and the pressing surface of the pressing member can be adjusted. Further, since the pressing member is fastened to the supporting member while the pressing member is in contact with the supporting member, it may be possible to firmly fasten the pressing member to the supporting member without being affected by loosening of screws, or the like. As a consequence, a set thickness decrement of the sheet can be maintained In the adjusting of the distance between the pressing surface of the pressing member and the base member in the height direction, the position in the height direction where the pressing member comes into contact with the supporting member is determined such that a decrement of a thickness of the sheet falls within a range from about 10% to about 20% of the thickness of the sheet. In this configuration, if there is a manufacturing error in the size of the sheet or the like, a temperature variation of the focus ring during a plasma process can be reduced.

In accordance with the various aspects and example embodiments, the thickness decrements of the sheet as the heat transfer medium can be adjusted, and a set thickness decrement of the sheet can be maintained.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
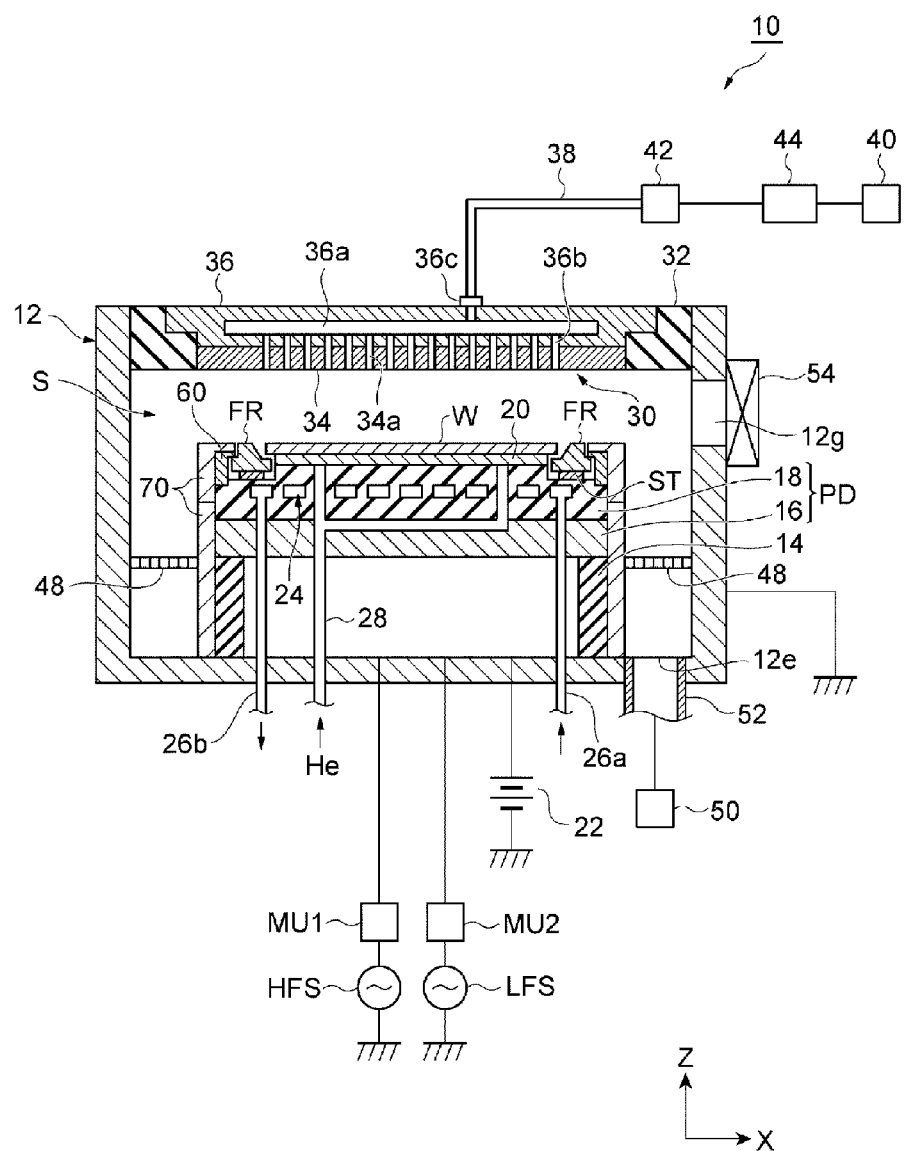
FIG. 1 is a cross sectional view schematically illustrating an example plasma processing apparatus.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current example embodiment. Still, the example embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

A plasma processing apparatus having a mounting table structure in accordance with an example embodiment will be first described. FIG. 1 is a cross sectional view schematically illustrating an example plasma processing apparatus. The plasma processing apparatus 10 in FIG. 1 is configured as a capacitively coupled parallel plate type plasma processing apparatus. The plasma processing apparatus 10 includes a substantially cylindrical processing chamber 12. An inner wall of the processing chamber 12 is made of anodically oxidized aluminum. The processing chamber 12 is frame-grounded.

A substantially cylindrical supporting member 14 made of an insulating material is provided on a bottom of the processing chamber 12. The supporting member 14 is vertically extended from the bottom of the processing chamber 12 within the processing chamber 12. The supporting member 14 is configured to support a mounting table PD provided within the processing chamber 12.

The mounting table PD is configured to hold a processing target object (workpiece) W on a top surface thereof. Below, the processing target object may be referred to as a "wafer." The mounting table PD includes a lower electrode 16, a base member 18 and an electrostatic chuck 20. The lower electrode 16 may be made of a metal such as, but not limited to, aluminum and has a substantially circular plate shape.

A first high frequency power supply HFS is connected to the lower electrode 16 via a matching unit MU1. The first high frequency power supply HFS is configured to generate a high frequency power for plasma generation having a frequency ranging from, e.g., about 27 MHz to about 100 MHz, for example about 40 MHz. The matching unit MU1 has a circuit for matching an output impedance of the first high frequency power supply HFS and an input impedance of a load side (lower electrode 16). Further, the lower electrode 16 is also connected to a second high frequency power supply LFS via a matching unit MU2. The second high frequency power supply LFS is configured to generate a high frequency power (high frequency bias power) for ion attraction on a wafer W to apply the generated high frequency bias power to the lower electrode 16. The high frequency bias power may have a frequency ranging from, e.g., about 400 kHz to about 13.56 MHz, for example, about 3 MHz. The matching unit MU2 has a circuit for matching an output impedance of the second high frequency power supply LFS and an input impedance of the load side (lower electrode 16).

The base member 18 is provided on the lower electrode 16. The base member 18 is made of a metal such as, but not limited to, aluminum, and has a substantially circular plate shape. The base member 18 is placed on the lower electrode 16 and is electrically connected with the lower electrode 16.

The electrostatic chuck 20 is provided on a central region of the base member 18. The electrostatic chuck 20 has a structure, as will be described later in detail, in which an electrode made of a conductive film is provided between a pair of insulating layers or insulating sheets. The electrode of the electrostatic chuck 20 is electrically connected with a DC power supply 22. The electrostatic chuck 20 is configured to attract and hold the wafer W by an electrostatic force such as a Coulomb force generated by a DC voltage applied from the DC power supply 22.

A focus ring FR is provided on a periphery region of the base member 18 to surround edges of the wafer W and the electrostatic chuck 20. The focus ring FR is an annular member and is configured to improve uniformity of a plasma process. The focus ring FR is made of a material appropriately determined depending on a material of a film on which the plasma process is to be performed. By way of example, but not limitation, the focus ring FR may be made of quartz.

A coolant path 24 is formed within the base member 18. A coolant of a certain temperature from an external chiller unit is supplied into and circulated through the coolant path 24 via pipelines 26a and 26b. The coolant may be an insulating liquid, e.g., a Galden (registered trademark). By controlling the temperature of the coolant circulated in this way, the temperature of the wafer W mounted on the mounting table PD can be controlled.

Further, the plasma processing apparatus 10 includes a gas supply line 28. The gas supply line 28 is configured to supply a heat transfer gas, e.g., a He gas, from a heat transfer gas supply device into a gap between a top surface of the electrostatic chuck 20 and a rear surface of the wafer W.

An upper electrode 30 is provided within the processing chamber 12. The upper electrode 30 is located above the mounting table PD to face the mounting table PD. The lower electrode 16 and the upper electrode 30 are substantially parallel to each other. Formed between the upper electrode 30 and the lower electrode 16 is a processing space S in which a plasma process is performed on the wafer W.

The upper electrode 30 is supported at a ceiling of the processing chamber 12 via an insulating shielding member 32. The upper electrode 30 may include an electrode plate 34 and an electrode supporting body 36. The electrode plate 34 faces the processing space S and has multiple gas discharge holes 34a. The electrode plate 34 may be made of a conductor or semiconductor having a low-resistance and a low Joul heat.

The electrode supporting body 36 is configured to detachably support the electrode plate 34 and may be made of a conductive material such as, but not limited to, aluminum. The electrode supporting body 36 may have a water-cooling structure. A gas diffusion space 36a is formed within the electrode supporting body 36, and a multiple number of gas through holes 36b communicating with the gas discharge holes 34a are extended downward from the gas diffusion space 36a. Further, a gas inlet opening 36c for introducing a processing gas into the gas diffusion space 36a is formed in the electrode supporting body 36, and a gas supply line 38 is connected to the gas inlet opening 36c.

A gas source 40 is connected to the gas supply line 38 via a valve 42 and a flow rate controller 44. One or more gases determined depending on a required plasma process are supplied from the gas source 40 into the processing space S via the gas supply line 38, the gas diffusion space 36a, the gas through holes 36b and the gas discharge holes 34a.

An exhaust plate 48 is provided around the mounting table PD in a lower portion of the processing chamber 12. By way of non-limiting example, the exhaust plate 48 may be formed by coating an aluminum member with ceramics such as $Y_2O_3$. An exhaust opening 12e is formed at a portion of the processing chamber 12 below the exhaust plate 48. An exhaust device 50 is connected to the exhaust opening 12e via an exhaust pipeline 52. The exhaust device 50 includes a vacuum pump such as a turbo molecular pump or the like and is capable of depressurizing the inside of the processing chamber 12 to a required vacuum degree. Further, a loading/unloading opening 12g for the wafer W is formed at a sidewall of the processing chamber 12, and this loading/unloading opening 12g is opened and closed by a gate valve 54.

In order to perform a plasma process on the wafer W in the plasma processing apparatus 10 having the above-described configuration, the wafer W is mounted on the electrostatic chuck 20. While the inside of the processing chamber 12 is being evacuated by the exhaust device 50, a gas is supplied into the processing chamber 12 from the gas source 40, and a pressure within the processing camber 12 is set to a required pressure level. Then, by supplying the high frequency powers from the high frequency power supplies HFS and LFS, plasma of the gas is generated within the processing chamber 12. The wafer W is processed by active species of atoms or molecules contained in the generated plasma.

Figure 2:
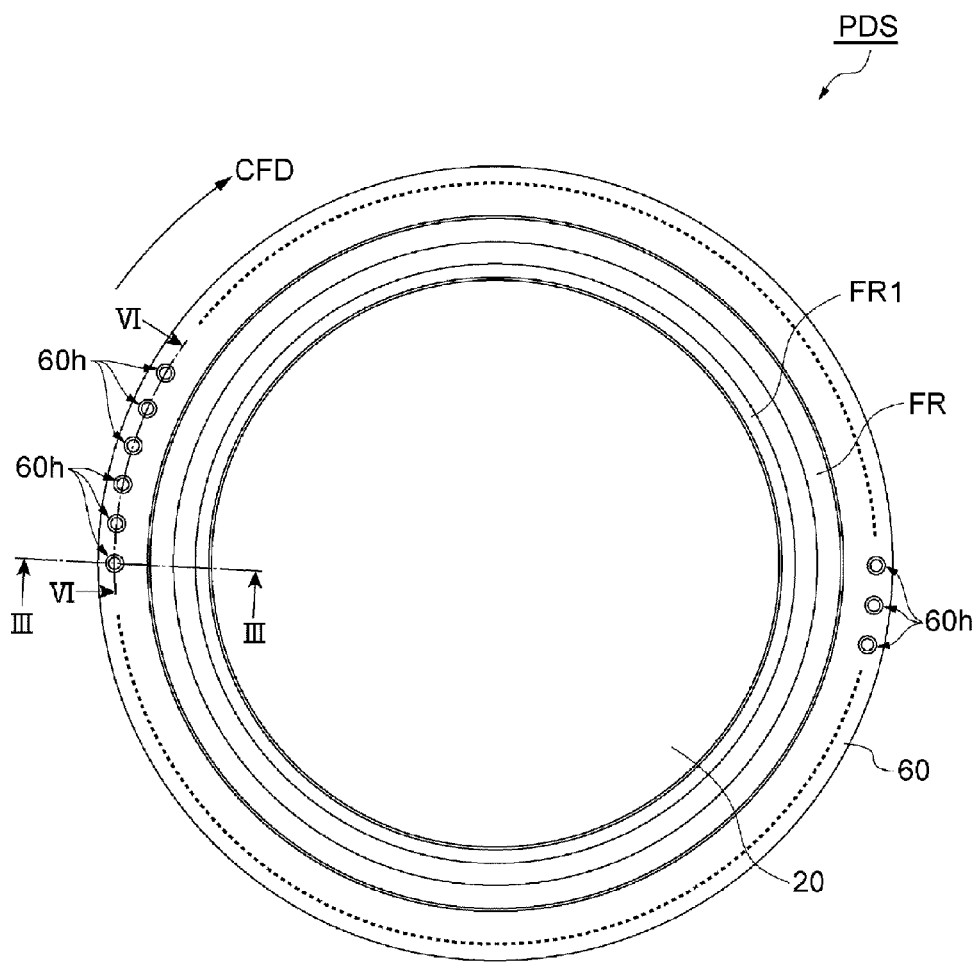
FIG. 2 illustrates a mounting table structure when viewed from above.
Figure 3:
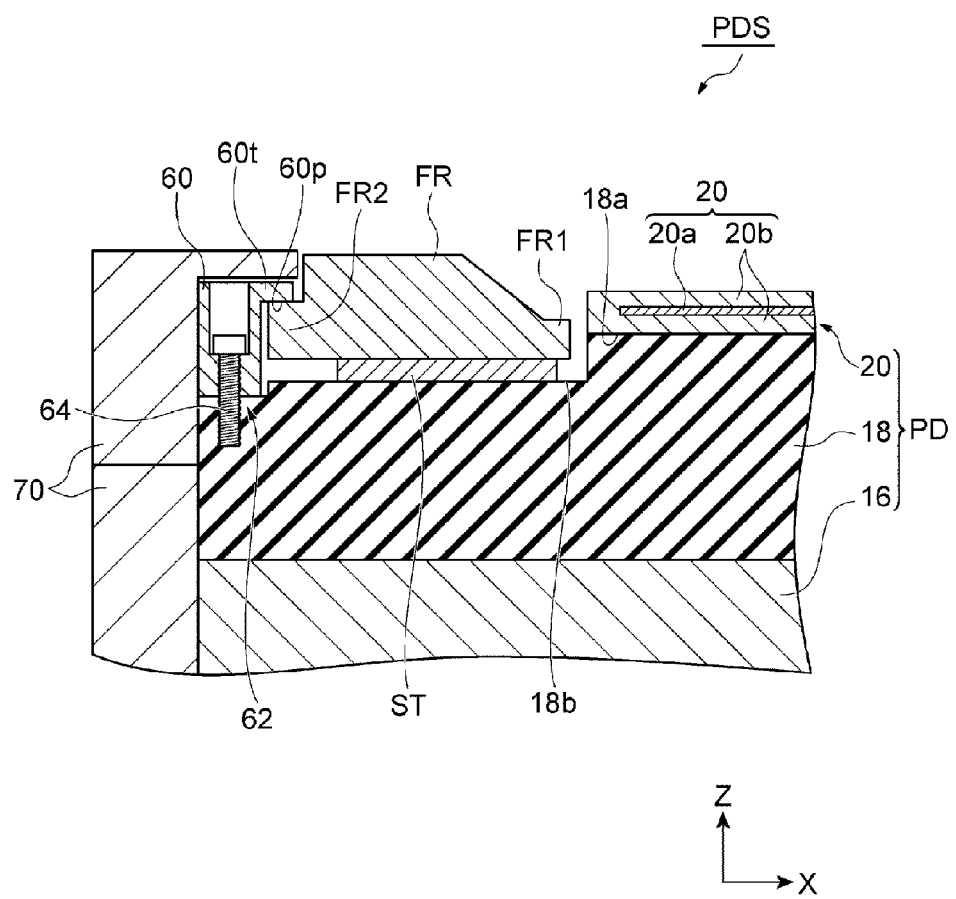
FIG. 3 is a cross sectional view taken along a line III-III of FIG. 2.

Now, a mounting table structure in the plasma processing apparatus 10 in accordance with an example embodiment will be elaborated. FIG. 2 is a plane view illustrating a mounting table structure in accordance with the example embodiment. FIG. 2 illustrates the mounting table structure when viewed from above. Further, FIG. 3 is a cross sectional view taken along a line III-III of FIG. 2. In FIG. 2, illustration of a cover 70 shown in FIG. 1 and FIG. 3 is omitted.

The mounting table structure PDS shown in FIG. 2 and FIG. 3 includes a mounting table PD. The mounting table structure PDS also includes a pressing member 60, a supporting member 62 and fixing members 64. The mounting table PD includes a base member 18 and an electrostatic chuck 20. As stated above, the base member 18 is made of a metal and has a substantially circulate plate shape. The base member 18 includes, as a top surface at a plasma generation side, a first surface 18a and a second surface 18b. The first surface 18a is provided at a central portion of the base member 18. The first surface 18a is a substantially flat circular surface facing upward, and the electrostatic chuck 20 is provided on the first surface 18a. The electrostatic chuck 20 includes a pair of insulating films 20b; and an electrode 20a that is made of a conductive film and is interposed between the pair of insulating films 20b.

The second surface 18b of the base member 18 is annularly extended around the first surface 18a to face upward. The second surface 18b is positioned lower than the first surface 18a in a height direction (Z direction). A focus ring FR is provided on the second surface 18b via a sheet ST. That is, the second surface 18b is provided under the sheet ST to face the sheet ST. In the example embodiment, the sheet ST may be annularly extended on the second surface 18b. Further, in the example embodiment, a bottom surface of the sheet ST is in contact with the second surface 18b of the base member 18, and a top surface of the sheet ST is in contact with a bottom surface of the focus ring FR.

The sheet ST serves as a heat transfer medium configured to transfer heat of the focus ring FR to the base member 18. Thus, the sheet ST has thermal conductivity. Further, since the sheet ST also has elasticity, it can be contracted in the thickness direction thereof when a pressure is applied thereto in the thickness direction. One example of the sheet ST may be a silicon sheet.

The focus ring FR is configured to improve uniformity of a plasma process in a radial direction of the wafer W. That is, the focus ring RF serves to uniform the plasma processes at a central portion of the wafer W and at an edge portion thereof. The focus ring FR is provided along the periphery of the electrostatic chuck 20 to surround edges of the electrostatic chuck 20 and the wafer W. In the example embodiment, the focus ring FR may be annularly extended on the second surface 18b.

In the example embodiment, the focus ring FR has, at an inner periphery portion thereof, a first thin portion FR1 having a smaller thickness than that of a central portion thereof in a radial direction. The first thin portion FR1 is located slightly lower than a top surface of the electrostatic chuck 20, and a periphery of the wafer W is located above the first thin portion FR1.

Further, in the example embodiment, the focus ring FR has, at an outer periphery portion thereof, a second thin portion FR2 having a smaller thickness than that of the central portion thereof in the radial direction. A top surface of the second thin portion FR2 is in contact with a pressing surface 60p of the pressing member 60 that presses the focus ring FR downward. In this configuration, the sheet ST provided between the focus ring FR and the second surface 18b is contracted in the thickness direction thereof and comes into firm contact with the focus ring FR and the second surface 18b. As a consequence, thermal resistance between the focus ring FR and the second surface 18b is reduced.

In this mounting table structure PDS, a distance between the pressing surface 60p and the second surface 18b can be adjusted by the pressing member 60. To elaborate, in the mounting table structure PDS, by changing a position of the pressing member 60 on the supporting member 62 in a circumferential direction thereof, a position where the pressing member 60 comes into contact with the supporting member 62 in the height direction (Z direction) can be selected. Further, in this mounting table structure PDS, the pressing member 60 can be fastened to the supporting member 62 by the fixing members 64 while contacting the pressing member 60 to the supporting member 62, which is fastened to the second surface 18b.

Figure 4:
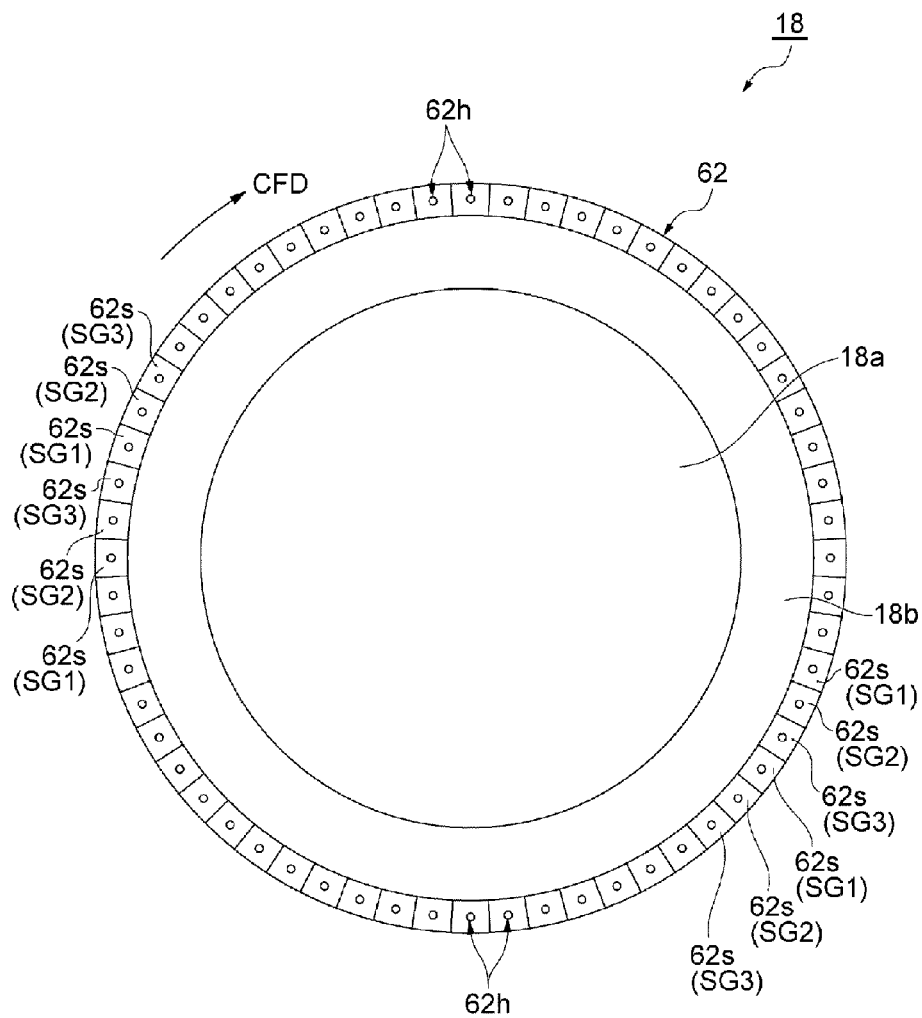
FIG. 4 is a plane view illustrating a base member including a supporting member.
Figure 5:
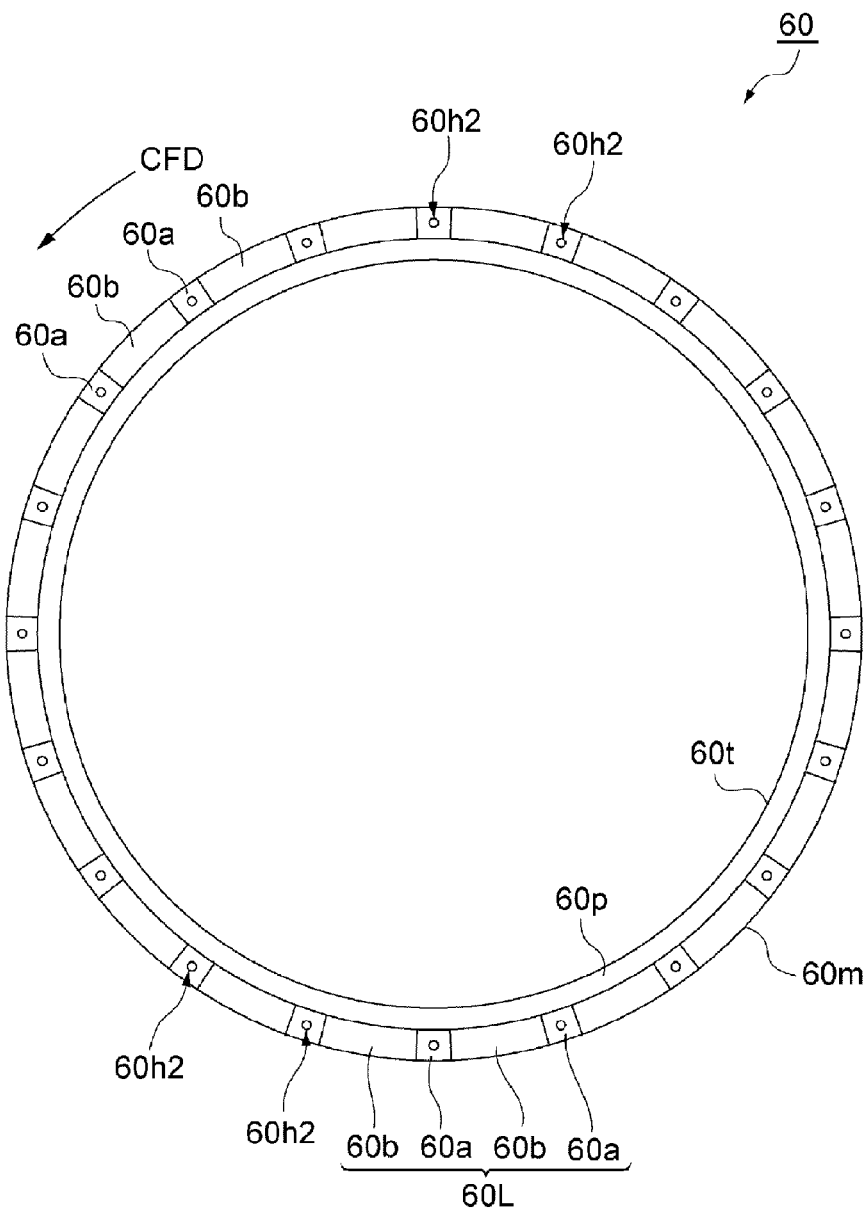
FIG. 5 is a plane view of a pressing member.
Figure 6:
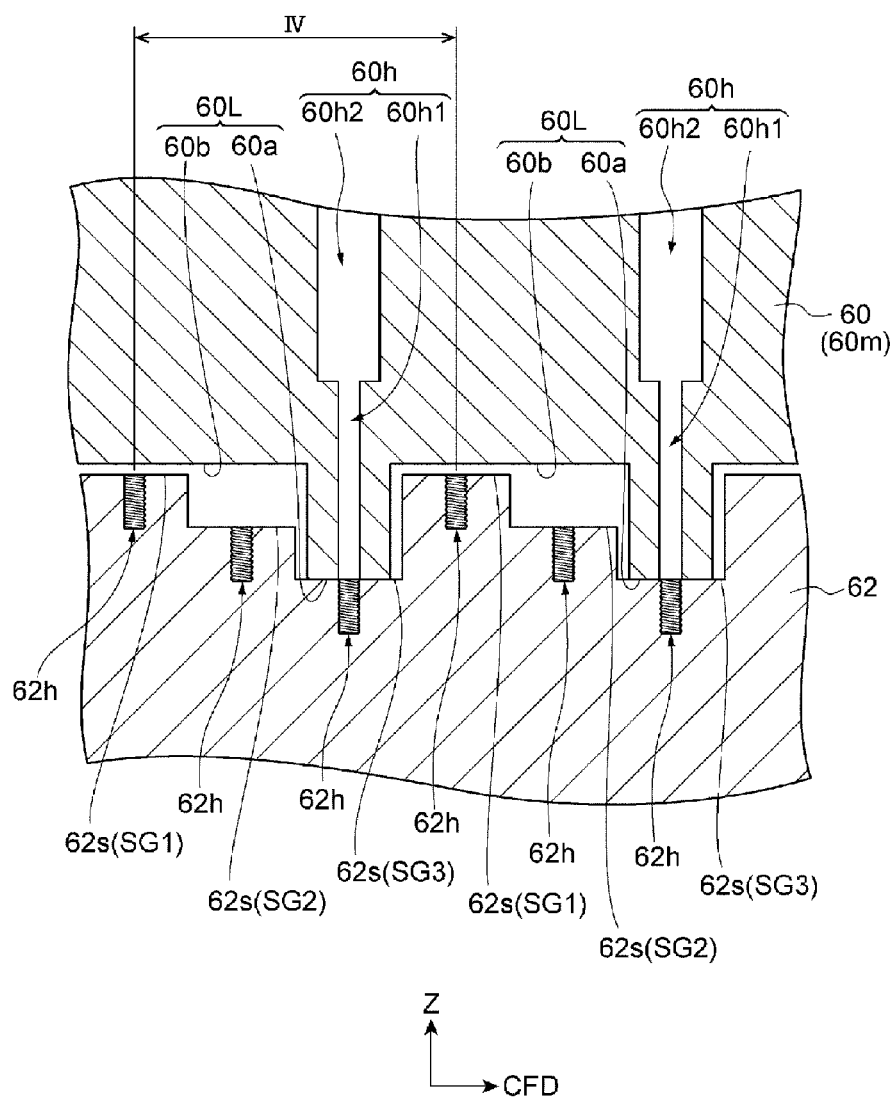
FIG. 6 is a cross sectional view taken along a line VI-VI of FIG. 2.

Hereinafter, the configuration of the mounting table structure PDS will be discussed in further detail with reference to FIG. 4 to FIG. 6 as well as FIG. 1 to FIG. 3. FIG. 4 is a plane view illustrating the base member including the supporting member. FIG. 5 is a plane view of the pressing member. FIG. 6 is a cross sectional view taken along a line VI-VI of FIG. 2. FIG. 4 illustrates the base member 18 including the supporting member 62 when viewed from above. FIG. 5 illustrates the pressing member 60 when viewed from below. FIG. 6 illustrates cross sections of the pressing member 60 and the supporting member 62 on the cross sectional view taken along the line VI-VI of FIG. 2.

The supporting member 62 is connected to the base member 18. As one example, in the present example embodiment, the supporting member 62 and the base member 18 serve as one body as shown in FIG. 3 and FIG. 4. That is, the supporting member 62 is formed at the base member 18 to be fastened thereto. In this example embodiment, since the supporting member 62 does not serve as a separate component, the number of components of the mounting table structure can be reduced. The supporting member 62 is extended from a periphery of the second surface 18b of the base member 18 in a circumferential direction (CFD). Here, the term "circumferential direction" implies a direction, on a plane orthogonal to the Z direction, along the circumference of a ring centered on an axial line orthogonal to the plane.

As depicted in FIG. 4 and FIG. 6, the supporting member 62 has multiple surfaces 62s that serves as contact surfaces to be brought into contact with the pressing member 60. The surfaces 62s are arranged in the circumferential direction CFD to face upward. The multiple surfaces 62s are divided into three surface groups SG1 to SG3. That is, the multiple surfaces 62s include a multiple number of first contact surfaces belonging to the first surface group SG1, a multiple number of second contact surfaces belonging to the second surface group SG2 and a multiple number of third contact surfaces belonging to the third surface group SG3.

As depicted in FIG. 4, the multiple surfaces 62s belonging to the first surface group SG1, i.e., the first contact surfaces are arranged at a preset interval IV (see FIG. 6) therebetween in the circumferential direction CFD. The multiple surfaces 62s belonging to the second surface group SG2, i.e., the second contact surfaces are also arranged at the interval IV therebetween in the circumferential direction CFD. Likewise, the multiple surfaces 62s belonging to the third surface group SG3, i.e., the third contact surfaces are also arranged at the interval IV therebetween in the circumferential direction CFD. That is, the multiple surfaces 62s are divided into the first to the third surface groups SG1 to SG3 in the arrangement order in the circumferential direction CFD.

The three surface groups SG1 to SG3 are provided at different positions in the height direction (Z direction). The multiple surfaces 62s (first contact surfaces) belonging to the first surface group SG1 are provided at a substantially same position in the height direction; the multiple surfaces 62s (second contact surfaces) belonging to the second surface group SG2 are provided at a substantially same position in the height direction; and the multiple surfaces 62s (third contact surfaces) belonging to the third surface group SG3 are provided at a substantially same position the height direction. Further, the multiple surfaces 62s (first contact surfaces) of the first surface group SG1, the multiple surfaces 62s (second contact surfaces) of the second surface group SG2 and the multiple surfaces 62s (third contact surfaces) of the third surface group SG3 are located at different positions from each other in the height direction. That is, surfaces located at different positions in the height direction are periodically formed on the supporting member 62.

Furthermore, multiple screw holes 62h extended from the surface 62s to an inside of the supporting member 62 in the Z direction are formed in the supporting member 62. A female screw is formed on an inner wall surface of each screw hole 62h. Male screws of the fixing members 64 are screwed into the screw holes 62h when the pressing member 60 is fastened to the supporting member 62, as will be described later.

The pressing member 60 is arranged along the periphery of the focus ring FR, and is configured to press the focus ring FR toward the second surface 18b of the base member 18. With this configuration, the pressing member 60 presses the sheet ST. The pressing member 60 is made of, by way of example, but not limitation, ceramic such as alumina. As shown in FIG. 5, the pressing member 60 has a substantially annular shape. As depicted in FIG. 3 and FIG. 5, the pressing member 60 has a main portion 60m and a thin portion 60t. The thin portion 60t is provided at an inner periphery of the pressing member 60. The thin portion 60t is connected to an upper part of the main portion 60m and is protruded inwardly more than the main portion 60m. A bottom surface of the thin portion 60t serves as the pressing surface 60p that presses the top surface of the second thin portion FR2 toward the second surface 18b of the base member 18.

Further, as depicted in FIG. 5 and FIG. 6, the main portion 60m of the pressing member 60 has a bottom surface 60L. The bottom surface 60L of the pressing member 60 has multiple contact surfaces 60a. The contact surfaces 60a are arranged at the preset interval IV in the circumferential direction CFD. Each of the contact surfaces 60a has a width smaller than the width of each surface 62s in the circumferential direction. Furthermore, each of the contact surfaces 60a protrudes downward more than the other portions of the pressing member 60. To elaborate, each contact surface 60a protrudes downward more than a region 60b of the lower surface 60L between neighboring contact surfaces 60a. A distance between the contact surface 60a and the region 60b of the bottom surface 60L in the height direction (Z direction) is larger than a distance between the surface group located at the highest position and the surface group located at the lowest position among the surface groups SG1 to SG3.

Furthermore, the pressing member 60 has multiple holes 60h extended from the contact surfaces 60a in the Z direction to penetrate the pressing member 60. Each of the holes 60h has a small diameter portion 60h1 and a large diameter portion 60h2. The small diameter portion 60h1 is extended from the contact surface 60a to a middle of the pressing member 60 in the Z direction. The large diameter portion 60h2 is extended from the small diameter portion 60h1 to a top surface of the pressing member 60 in the Z direction. The diameter of the large diameter portion 60h2 is larger than the diameter of the small diameter portion 60h1. Accordingly, a step-shaped surface is formed between the large diameter portion 60h2 and the small diameter portion 60h1. A head portion of the screw as the fixing member 64 comes into contact with this step-shaped surface.

In this mounting table structure PDS, as shown in FIG. 6, by rotating the pressing member 60 in the circumferential direction CFD, it is possible to select the surfaces 62s belonging to one of the surface groups SG1 to SG3 as surfaces which the contact surfaces 60a of the pressing member 60 would make contact with. That is, one of the group of the first contact surfaces, the group of the second contact surfaces and the group of the third contact surfaces can be selected as the surfaces that make contact with the contact surfaces 60a of the pressing member 60. In this way, the position in the height direction (Z direction) where the pressing member 60 comes into contact with the supporting member 62 can be selected. As a consequence, the distance between the pressing surface 60p and the second surface 18b in the height direction (Z direction) can be adjusted. Further, while the contact surfaces 60a of the pressing member 60 come into contact with the selected surface group, by screwing the fixing members 64, i.e., the screws 64 into the screw holes of the supporting member 62 through the holes 60h of the pressing member 60, the pressing member 60 can be firmly fastened to the supporting member 62.

As shown in FIG. 3, in the mounting structure PDS, while the pressing member 60 is fastened to the supporting member 62, the cover 70 is installed to cover an outer peripheral surface of the mounting table PD and a surface of the pressing member 60. The cover 70 may be made of, by way of non-limiting example, ceramic such as quartz. As depicted in FIG. 3, the cover 70 may be divided in two or more parts.

In the mounting table structure PDS configured as described above, even if there is a manufacturing error in the thickness of the second thin portion FR2, the distance between the pressing surface 60$p$ of the pressing member 60 and the second surface 18$b$, the thickness of the sheet ST or the like, by selecting one of the surface groups SG1 to SG3 as the surfaces that make contact with the contact surfaces 60$a$ of the pressing member 60, a thickness decrement of the sheet ST can be made to be approximate to a design value.

Figure 7A:
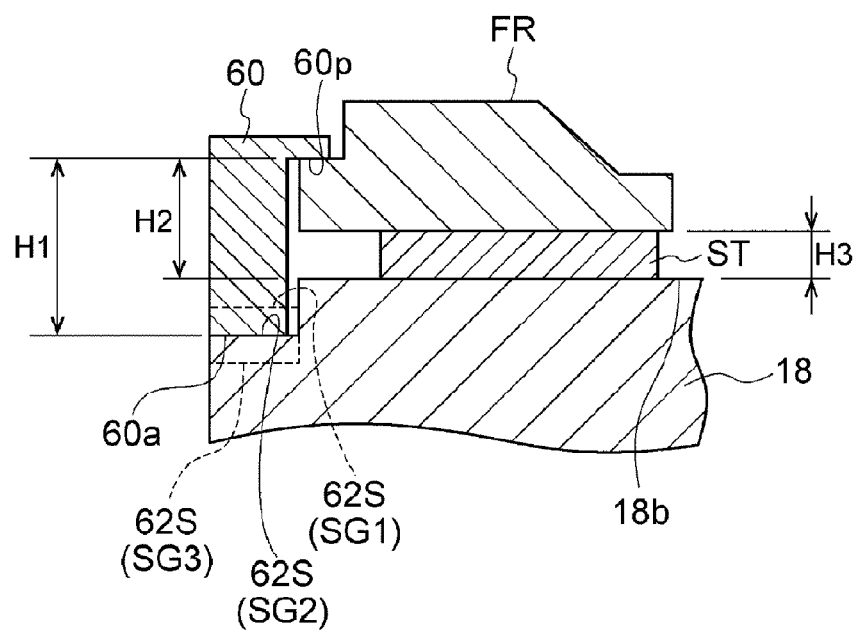
FIG. 7A and FIG. 7B are conceptual diagrams for describing a method of adjusting a thickness decrement of a sheet.

FIG. 7A to FIG. 8B are conceptual diagrams for describing a method for adjusting a thickness decrement of the sheet. In the mounting table structure PDS, a design value of the height position of the surface group SG2, which is located at a midway position in the height direction (Z direction), may be set such that a thickness decrement of the sheet ST when the contact surfaces 60$a$ of the pressing member 60 are brought into contact with the surface group SG2 becomes a design value. Further, a distance between the surface groups SG2 and SG1 in the height direction and a distance between the surface groups SG2 and SG3 in the height direction, i.e., the shortest distances between the surface groups are set to correspond to an adjustment range $\Delta h$ of the thickness decrement of the sheet ST. In this mounting table structure PDS, as shown in FIG. 7A and FIG. 8A, if the contact surfaces 60$a$ are brought into contact with the surface group SG2, the distance between the second surface 18$b$ and the pressing surface 60$p$ in the height direction becomes H2 and the thickness of the sheet becomes H3. Further, the distance between the contact surfaces 60$a$ and the pressing surface 60$p$ of the pressing member 60 in the height direction is H1.

Figure 7B:
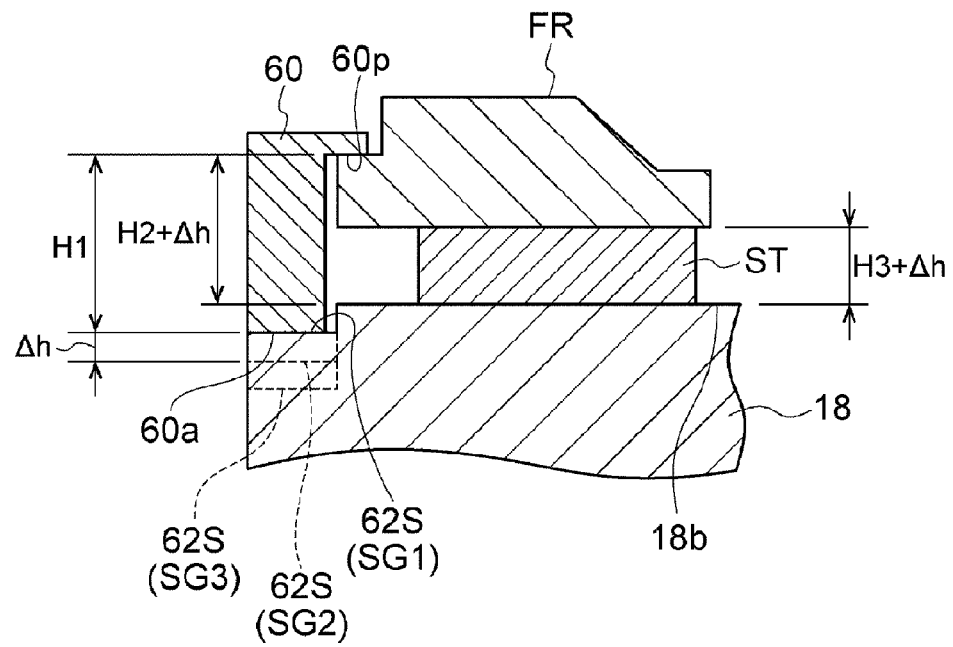

If a thickness decrement of the sheet ST becomes larger than the design value when the contact surfaces 60$a$ of the pressing member 60 are brought into contact with the surface group SG2, a position of the pressing member 60 in the circumferential direction CFD may be selected such that the contact surfaces 60$a$ come into contact with the surface group SG1 located at a higher position than the surface group SG2, as shown in FIG. 7B. The position of the pressing surface 60$p$ of the pressing member 60 in the height direction (Z direction) in the example shown in FIG. 7B becomes higher than the position of the pressing surface 60$p$ in the height direction in the example shown in FIG. 7A by the adjustment range $\Delta h$. As a result, the distance between the second surface 18$b$ and the pressing surface 60$p$ becomes H2+$\Delta h$, and the thickness of the sheet ST becomes H3+$\Delta h$. Accordingly, the thickness decrement of the sheet in the example shown in FIG. 7B becomes smaller than the thickness decrement in the example shown in FIG. 7A by the adjustment range $\Delta h$.

Figure 8A:
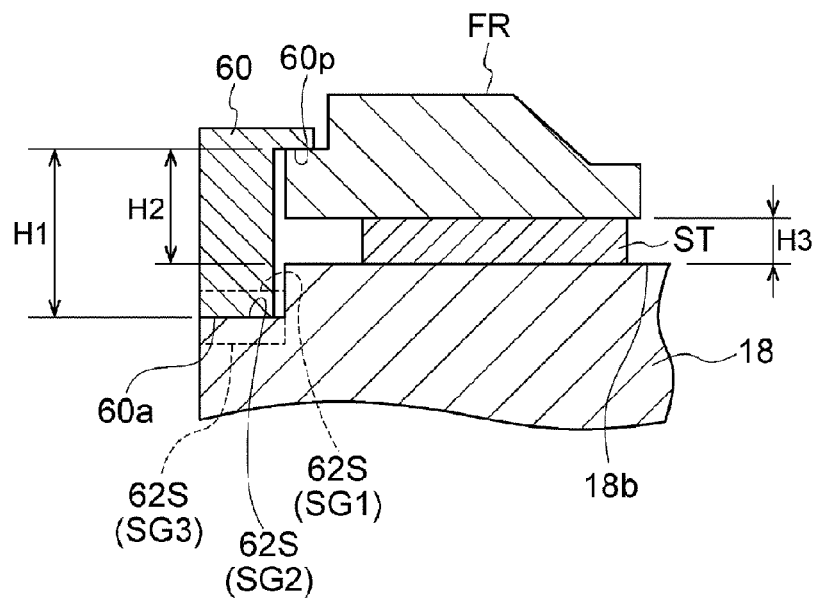
FIG. 8A and FIG. 8B are conceptual diagrams for describing the method of adjusting a thickness decrement of a sheet.
Figure 8B:
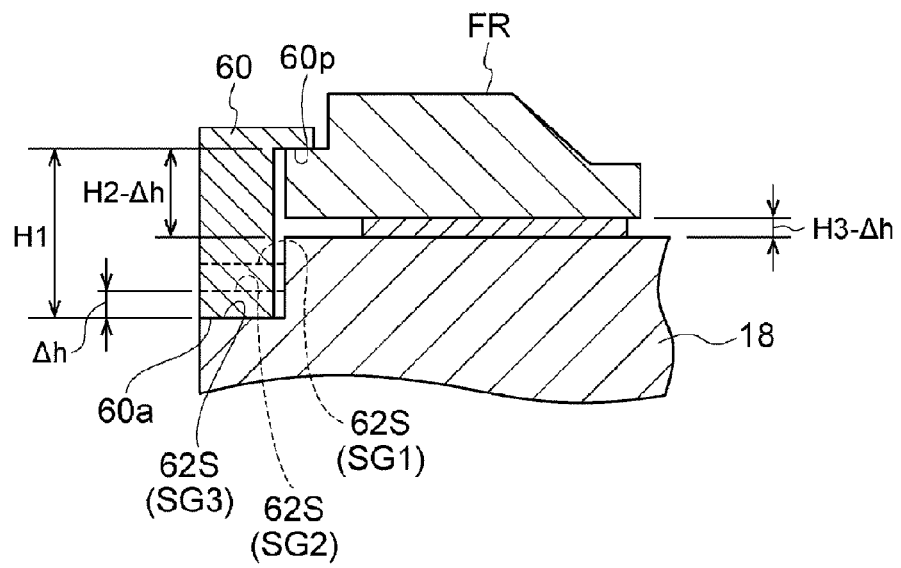

Meanwhile, if a thickness decrement of the sheet ST becomes smaller than the design value when the contact surfaces 60$a$ of the pressing member 60 are brought into contact with the surface group SG2, the position of the pressing member 60 in the circumferential direction CFD may be adjusted such that the contact surfaces 60$a$ come into contact with the surface group SG3 located at a lower position than the surface group SG2, as shown in FIG. 8B. The position of the pressing surface 60$p$ of the pressing member 60 in the height direction (Z direction) in the example shown in FIG. 8B becomes lower than the position of the pressing surface 60$p$ in the height direction in the example shown in FIG. 8A by the adjustment range $\Delta h$. As a result, the distance between the second surface 18$b$ and the pressing surface 60$p$ becomes H2−$\Delta h$, and the thickness of the sheet ST becomes H3−$\Delta h$. Accordingly, the thickness decrement of the sheet in the example shown in FIG. 8B becomes larger than the thickness decrement in the example shown in FIG. 8A by the adjustment range $\Delta h$.

Figure 9:
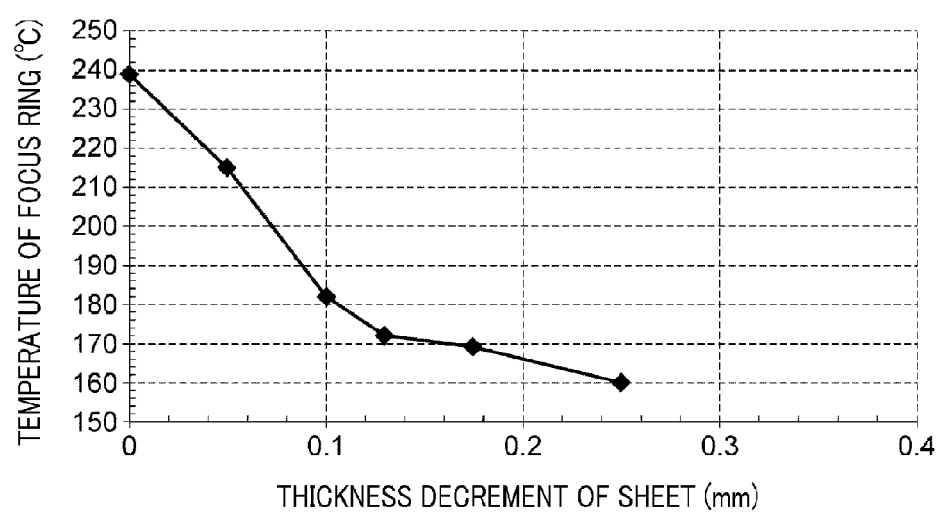
FIG. 9 is a chart showing a relationship between a thickness decrement of a sheet and a temperature of a focus ring.

FIG. 9 is a chart showing a relationship between a thickness decrement of a sheet and a temperature of a focus ring. FIG. 9 provides a measurement result of a relationship between a thickness decrement of a sheet and a temperature of a focus ring when a plasma process is performed in the plasma processing apparatus shown in FIG. 1 having a conventional mounting table structure. In FIG. 9, a horizontal axis represents a thickness decrement (mm) of the sheet and a vertical axis indicates a temperature of the focus ring. Here, the thickness of the sheet is about 1 mm, and a thickness decrement of about 0.1 mm corresponds to a thickness decrement ratio of about 10%.

As shown in FIG. 9, if the thickness decrement of the sheet is set within a range from, e.g., about 0.1 mm to about 0.2 mm, i.e., if the thickness decrement ratio of the sheet is set within a range from, e.g., about 10% to about 20%, a temperature variation of the focus ring would be decreased. That is, if the thickness decrement of the sheet is set within the range of, e.g., about 10% to about 20% with respect to the thickness of the sheet, the temperature variation of the focus ring FR in the plasma process can be reduced even if there is a manufacturing error in the thickness of the second thin portion FR2, the distance between the pressing surface 60$p$ of the pressing member 60 and the second surface 18$b$, the thickness of the sheet ST, or the like. Meanwhile, if the thickness decrement of the sheet is set within a range from, e.g., about 0.0 mm to about 0.1 mm, i.e., if the thickness decrement ratio of the sheet is set within a range from, e.g., about 0% to about 10%, the temperature variation of the focus ring would be increased. Further, if the thickness decrement of the sheet exceeds, e.g., about 0.3 mm, i.e., if the thickness decrement ratio of the sheet exceeds, e.g., about 30%, a great force may be applied to the components configured to reduce the thickness of the sheet, so that the components may be damaged.

In the mounting table structure PDS, the design value of the height position of the surface group SG2, which is located at the midway position in the height direction (Z direction), can be set such that a thickness decrement of the sheet ST when the contact surfaces 60$a$ of the pressing member 60 come into contact with the surface group SG2 becomes the design value. Further, the shortest distance between the surface groups in the height direction, i.e., the adjustment range $\Delta h$ can be set to be about 0.1 mm, i.e., a distance equivalent to about 10% of the thickness of the sheet. By selecting the surface group which would make contact with the contract surfaces 60$a$ of the pressing member 60 among the surface groups SG1 to SG3, the thickness decrement of the sheet can be set within the range from about 0.1 mm to about 0.2 mm, i.e., the thickness decrement ratio of the sheet can be set within the range from about 10% to about 20%.

Furthermore, the shortest distance between the surface groups in the height direction may be appropriately selected depending on the thickness of the sheet ST and the thickness decrement thereof, without being limited to the aforementioned example distance. Further, although the three surface groups SG1 to SG3 are provided in the above-described example embodiment, the number of the surface groups only needs to be equal to or more than two. That is, since two or more surface groups are provided, the contact surface 60$a$ of the pressing member 60 can be brought into contact with the surface group located at a higher position when the thickness decrement of the sheet ST is large, whereas the contact surfaces 60a of the pressing member 60 can be brought into contact with the surface group located at a lower position when the thickness decrement of the sheet ST is small. In this way, the thickness decrement of the sheet ST can be adjusted as required. Here, it may be also possible to provide more than three surface groups.

Figure 10:
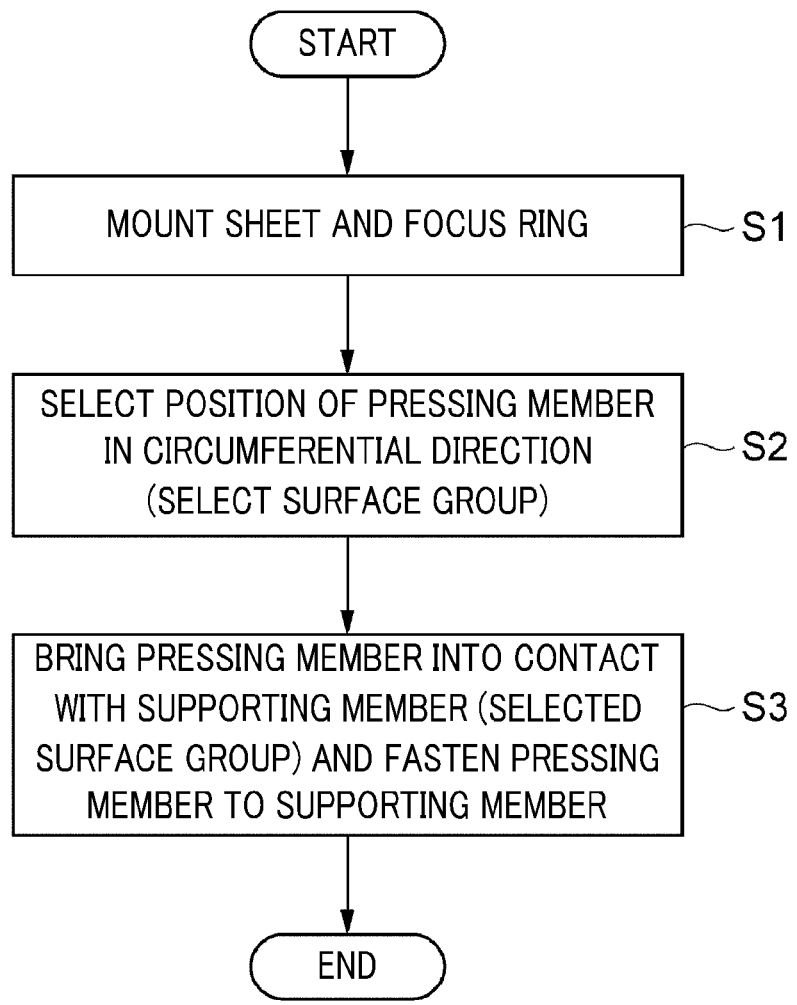
FIG. 10 is a flowchart for describing a method of holding a focus ring in accordance with an example embodiment.

Now, a method of holding a focus ring in accordance with the example embodiment will be discussed. FIG. 10 is a flowchart for describing the method of holding a focus ring in accordance with the example embodiment. In the following description, the method of holding the focus ring of the mounting table structure PDS as described in the above example embodiment will be explained.

As depicted in FIG. 10, at block 51 (Mount Sheet and Focus Ring), the focus ring FR is mounted on the second surface 18b of the base member 18 via the sheet ST therebetween. At block S1, the focus ring FR is arranged along the periphery of the electrostatic chuck 20. Then, at block S2 (Select Position of Pressing Member in Circumferential Direction (Select Surface Group)), a position of the pressing member 60 in the circumferential direction CFD is selected. When using the mounting table structure PDS, at block S2, a surface group that would make contact with the contact surfaces 60a of the pressing member 60 is selected among the surface groups SG1 to SG3. Accordingly, at block S2, a position of the pressing member 60 in the height direction (Z direction) where the pressing member 60 comes into contact with the supporting member 62 is determined. As a result, a distance between the base member 18 and the pressing surface 60p of the pressing member 60 that comes into contact with the focus ring FR is adjusted.

In the example embodiment, at block S2, the position in the height direction where the pressing member 60 comes into contact with the supporting member 62 is determined such that a thickness decrement of the sheet ST falls within a range from about 10% to about 20% of the thickness of the sheet ST. In accordance with the present example embodiment, as elaborated above with reference to FIG. 9, it may be possible to reduce a temperature variation of the focus ring FR during a plasma process even if there is a manufacturing error in the thickness of the second thin portion FR2, the distance between the pressing surface 60p of the pressing member 60 and the second surface 18b, the thickness of the sheet ST, or the like.

At block S2, the position of the pressing member 60 in the circumferential direction CFD may be selected by calculating a thickness decrement of the sheet ST when the pressing surfaces 60a of the pressing member 60 are brought into contact with the supporting member 62. Alternatively, at block S2, the position of the pressing member 60 in the circumferential direction CFD may be selected such that the required thickness decrement of the sheet ST can be obtained based on actual sizes of components configured to reduce the thickness of the sheet ST.

Subsequently, at block S3 (Bring Pressing Member into Contact with Supporting member (Selected Surface Group) and Fasten Pressing Member to Supporting member), while the pressing member 60 is brought into contact with the supporting member 62 at a determined height position, the pressing member 60 is fastened to the supporting member 62 by using the fixing members 64. When using the mounting table structure PDS, while the contact surfaces 60a of the pressing member 60 are brought into contact with the selected surface group, the pressing member 60 is fastened to the supporting member 62 by using the fixing members 64. Accordingly, it may become possible to hold the focus ring FR while achieving the required thickness decrement of the sheet ST. Further, since the pressing member 60 is fastened to the supporting member 62 while the pressing member 60 comes into contact with the supporting member 62, the set thickness decrement of the sheet ST can be maintained.

Figure 11:
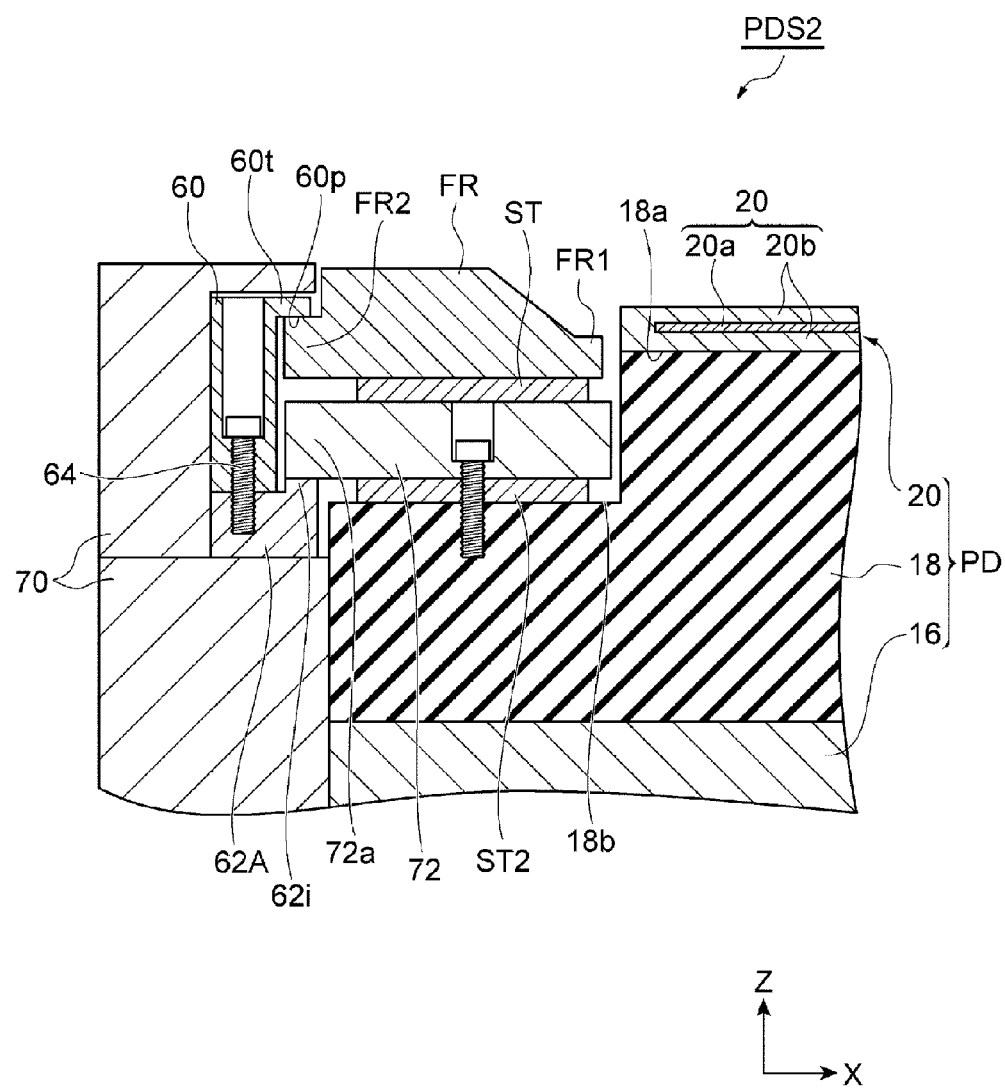
FIG. 11 is a cross sectional view illustrating a mounting table structure in accordance with another example embodiment.
Figure 12:
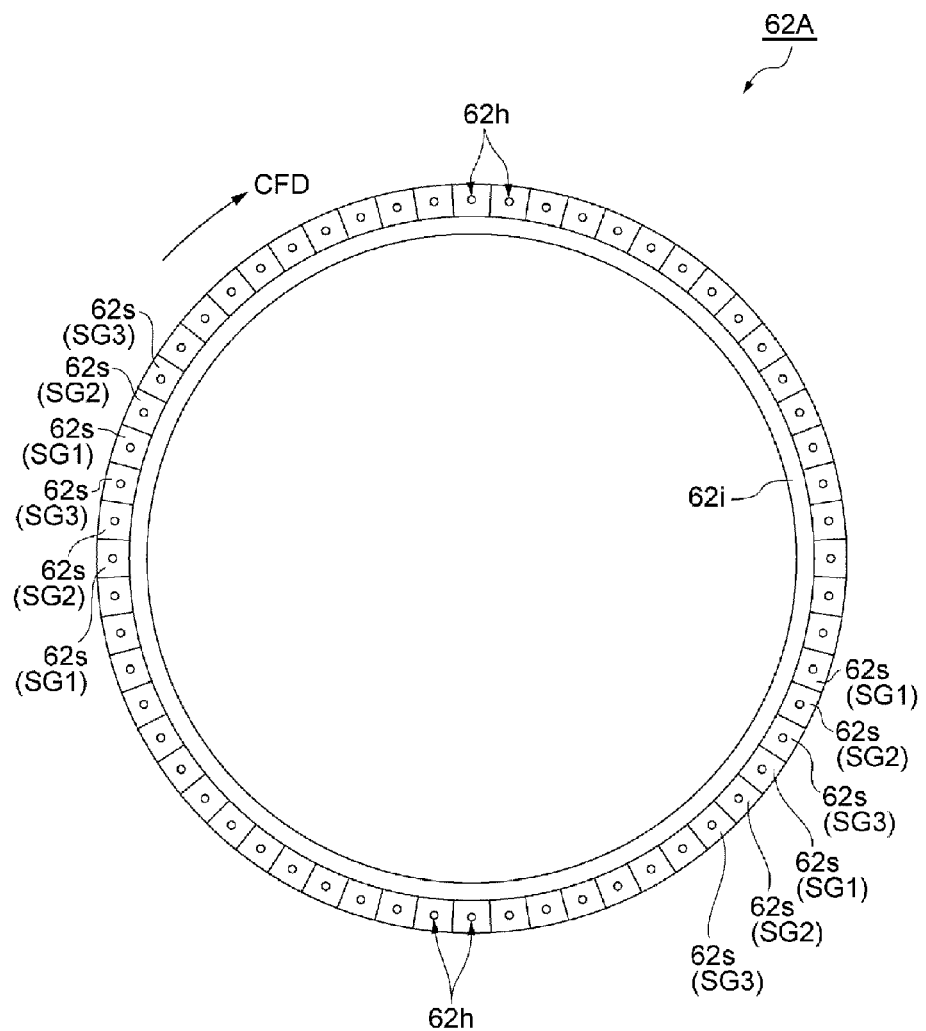
FIG. 12 is a plane view illustrating a supporting member of the mounting table structure in accordance with the another example embodiment.

Below, a mounting table structure in accordance with another example embodiment will be described. FIG. 11 is a cross sectional view illustrating a mounting table structure in accordance with another example embodiment. FIG. 11 illustrates a cross section of the mounting table structure PDS2 in accordance with the another example embodiment, which corresponds to FIG. 3. FIG. 12 is a plane view illustrating a supporting member of the mounting table structure in the another example embodiment. FIG. 12 illustrates the supporting member of the mounting table structure viewed from above.

The mounting table structure PDS2 shown in FIG. 11 is distinguishable from the mounting table structure PDS in that the supporting member is configured as a separate component from a base member 18. Further, the mounting table structure PDS2 is also different from the mounting table structure PDS in that an annular member 72 and a sheet ST2 are further provided between a focus ring FR and a second surface 18b in addition to a sheet ST. Hereinafter, the mounting table structure PDS2 will be elaborated, focusing on these distinctive parts different from the mounting table structure PDS.

The annular member 72 is made of a metal such as, but not limited to, aluminum. The annular member 72 is annularly extended on the second surface 18b. The sheet ST is provided between the annular member 72 and the focus ring FR. Further, the sheet ST2 is provided between the annular member 72 and the second surface 18b. Like the sheet ST, the sheet ST2 is also a heat transfer medium and is configured to transfer heat of the focus ring FR to the base member 18. The sheet ST2 is annularly extended on the second surface 18b.

As depicted in FIG. 11, holes are formed in the annular member 72 to penetrate the annular member 72 in the Z direction. Screw holes are formed in the base member 18 at positions corresponding to the holes of the annular member 72 to be extended from the surface 18b in the Z direction, and a female screw is formed on an inner wall surface of each screw hole. As the screws inserted through the holes of the annular member 72 are screwed into the screw holes extended from the second surface 18b of the base member 18, the annular member 72 is pressed against the second surface 18b, and the sheet ST2 is contracted in the thickness direction thereof.

As shown in FIG. 11, an outer peripheral portion 72a of the annular member 72 in a radial direction thereof is protruded outward more than the base member 18. In the mounting table structure PDS2, a supporting member 62A comes into contact with a bottom surface of the outer peripheral portion 72a of the annular member 72. That is, in the mounting table structure PDS2, when the supporting member 62A and the base member 18 are connected, the supporting member 62A is indirectly connected to the base member 18 via the annular member 72.

As illustrated in FIG. 12, the supporting member 62A has an annular shape and is made of, but not limited to, ceramic such as alumina. The supporting member 62A has an inner peripheral portion 62i, and a top surface of the inner peripheral portion 62i is in contact with the bottom surface of the outer peripheral portion 72a of the annular member 72, as shown in FIG. 11.

Referring to FIG. 12, the supporting member 62A has multiple surfaces 62s facing upward. The surfaces 62s are located at a position outer than the inner peripheral portion 62i in a radial direction. The surfaces 62s are arranged in a circumferential direction CFD, like the surface 62s of the mounting table structure PDS. Further, like the surfaces 62s of the mounting table structure PDS, the surfaces 62s of the mounting table structure PDS2 are also divided into three surface groups SG1 to SG3. That is, the surfaces 62s of the mounting table structure PDS2 also include first contact surfaces belonging to the first surface group SG1, second contact surfaces belonging to the second surface group SG2 and third contact surfaces belonging to the third surface group SG3.

In this mounting table structure PDS2, while the inner peripheral portion 62i of the supporting member 62A as a separate component from the base member 18 is in contact with the bottom surface of the outer peripheral portion 72a of the annular member 72, and a pressing surface 60p of a pressing member 60 is in contact with a top surface of a second thin portion FR2 of the focus ring FR, the pressing member 60 is fastened to the supporting member 62A by using fixing members 64. Accordingly, the pressing member 60 presses the focus ring RF against the annular member 72, and the thickness of the sheet ST is reduced.

Further, by rotating the pressing member 60 in the circumferential direction CFD, one of the surface groups SG1 to SG3 can be selected as surfaces which contact surfaces 60a of the pressing member 60 make contact with. Accordingly, a distance between the pressing surface 60p and the second surface 18b in the height direction (Z direction) can be adjusted. While the contact surfaces 60a of the pressing member 60 come into contact with the selected surface group, by screwing the fixing members 64, i.e., screws 64 into the screw holes of the supporting member 62A, the pressing member 60 can be firmly fastened to the supporting member 62A. At this time, it may not be necessary to control the torque of the screws 64.

In this mounting table structure PDS2 configured as described above, even if there is a manufacturing error in the thickness of the second thin portion FR2, the distance between the pressing surface 60p of the pressing member 60 and the second surface 18b, the thickness of the sheet ST, the thickness of the sheet ST2, the thickness of the annular member 72, or the like, by selecting one of the surface groups SG1 to SG3 of the supporting member 62A as the surfaces that make contact with the contact surfaces 60a of the pressing member 60, a thickness decrement of the sheet ST can be made to be approximate to a design value.

The method of holding a focus ring described in FIG. 10 can also be applied to this mounting table structure PDS2. In such a case, prior to the block S1, the sheet ST2 is mounted on the second surface 18b, the annular member 72 is mounted on the sheet ST2, and then the annular member 72 is fastened to the base member 18 by a screw. Then, at block S1, the focus ring RF is mounted on the second surface 18b, specifically, on the annular member 72 via the sheet ST. Then, at block S2, by selecting a position of the pressing member 60 on the supporting member 62A in the circumferential direction, one of the surface groups that would make contact with the contact surfaces 60a of the pressing member 60 is selected. Then, at block S3, while the contact surfaces 60a of the pressing member 60 are brought into contact with the selected surface group of the supporting member 62A, the pressing member 60 is fastened to the supporting member 62A by using the fixing members 64. As a consequence, it becomes possible to hold the focus ring FR while achieving a required thickness decrement of the sheet ST. Further, since the pressing member 60 is fastened to the supporting member 62A while the pressing member 60 in contact with the supporting member 62A, the set thickness decrement of the sheet ST can be maintained.

From the foregoing, it will be appreciated that various embodiments of the present disclosure have been described herein for purposes of illustration, and that various modifications may be made without departing from the scope and spirit of the present disclosure. By way of example, although the above-described plasma processing apparatus is configured as a capacitively coupled parallel plate type plasma processing apparatus, a plasma source of the plasma processing apparatus capable of employing the mounting table structures in accordance with the above-described example embodiments may not be particularly limited. For example, the mounting table structures of the above-described example embodiments may be applicable to various types of plasma processing apparatus such as a plasma processing apparatus using a microwave, an inductively coupled plasma processing apparatus, or the like.

Furthermore, in the above-described example embodiments, the supporting member having multiple surface groups located at different height positions is employed. However, the shape of the supporting member may not be particularly limited as long as there is employed a configuration where a position of the pressing member in the height direction where the pressing member comes into contact with the supporting member can be selected by altering the position of the pressing member on the supporting member in the circumferential direction. By way of non-limiting example, the supporting member may have surfaces (contact surfaces) of which height positions are changed continually in the circumferential direction.

We claim:

1. A mounting table structure including an electrostatic chuck at a central region thereof and a base member that mounts thereon a focus ring along a periphery of the electrostatic chuck, the mounting table structure comprising:
   a sheet, having elasticity and thermal conductivity, provided between the focus ring and the base member;
   a pressing member provided along a periphery of the focus ring, and configured to press the focus ring toward the base member to contract the sheet; and
   a supporting member connected to the base member,
   wherein the pressing member includes a pressing surface that presses the focus ring toward the base member and a plurality of contact surfaces that face downward and are arranged at a predetermined interval in a circumferential direction thereof,
   the supporting member includes first contact surfaces and second contact surfaces,
   the first contact surfaces are arranged at the predetermined interval in the circumferential direction,
   the second contact surfaces are arranged at the predetermined interval in the circumferential direction such that the second contact surfaces and the first contact surfaces are alternately arranged on a single circle when viewed from above the supporting member,
   the first contact surfaces are located at a position different from that of the second contact surfaces in a height direction, and
   the contact surfaces of the pressing member are protruded from portions of the pressing member at a distance larger than distances of the first contact surfaces and the second contact surfaces in the height direction.

2. The mounting table structure of claim 1,
   wherein the supporting member further includes third contact surfaces,
   the third contact surfaces are arranged at the predetermined interval in the circumferential direction and are located at a position different from those of the first contact surfaces and the second contact surfaces in the height direction, and the contact surfaces of the pressing member are protruded from the portions of the pressing member at a distance larger than distances of the first contact surfaces, the second contact surfaces and the third contact surfaces in the height direction.

3. The mount table structure of claim 1, wherein the supporting member and the base member serve as a single body.

4. A method of holding a focus ring in a mounting table structure including: an electrostatic chuck at a central region thereof; a base member that mounts thereon a focus ring; a pressing member that includes a plurality of contact surfaces arranged in a circumferential direction thereof; and a supporting member that includes first contact surfaces and second contact surfaces that are arranged in the circumferential direction and are alternately arranged on a single circle when viewed from above the supporting member, the first contact surfaces being located at a position different from that of the second contact surfaces in a height direction, the method comprising:

mounting the focus ring along a periphery of the electrostatic chuck such that a sheet having elasticity and thermal conductivity is provided between the base member and the focus ring;

adjusting a distance between a pressing surface of the pressing member contacted to the focus ring and the base member in the height direction by determining a position in the height direction where the pressing member comes into contact with the supporting member connected to the base member by selecting a position of the pressing member on the supporting member in the circumferential direction; and fastening the pressing member to the supporting member while the pressing member is in contact with the supporting member at the determined position in the height direction.

5. The method of claim 4, wherein, in the adjusting of the distance between the pressing surface of the pressing member and the base member in the height direction, the position in the height direction where the pressing member comes into contact with the supporting member is determined such that a decrement of a thickness of the sheet falls within a range from about 10% to about 20% of the thickness of the sheet.

6. The mounting table structure of claim 1, wherein a thickness decrement of the sheet is adjusted by selecting surfaces between the first contact surfaces and the second contact surfaces as surfaces that make contact with the plurality of contact surfaces of the pressing member.

* * * * *